United States Patent
Guo et al.

(10) Patent No.: US 7,480,173 B2
(45) Date of Patent: Jan. 20, 2009

(54) SPIN TRANSFER MRAM DEVICE WITH NOVEL MAGNETIC FREE LAYER

(75) Inventors: Yimin Guo, San Jose, CA (US); Cheng T. Horng, San Jose, CA (US); Ru-Ying Tong, Los Gatos, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 147 days.

(21) Appl. No.: 11/717,347

(22) Filed: Mar. 13, 2007

(65) Prior Publication Data

US 2008/0225583 A1    Sep. 18, 2008

(51) Int. Cl.
*G11C 11/00* (2006.01)

(52) U.S. Cl. ............... 365/158; 365/171; 365/173; 257/421; 438/3; 977/935

(58) Field of Classification Search ............ 365/158, 365/171, 173; 977/934, 935; 257/421, E21.665; 438/3

See application file for complete search history.

(56) References Cited

U.S. PATENT DOCUMENTS

| | | | |
|---|---|---|---|
| 5,695,864 A | 12/1997 | Slonczewski | |
| 6,532,164 B2 | 3/2003 | Redon et al. | |
| 6,714,444 B2 | 3/2004 | Huai et al. | |
| 6,929,957 B2 * | 8/2005 | Min et al. | 438/3 |
| 7,067,331 B2 | 6/2006 | Slaughter et al. | |
| 7,083,988 B2 | 8/2006 | Deak | |
| 7,126,202 B2 | 10/2006 | Huai et al. | |
| 2005/0059170 A1 * | 3/2005 | Min et al. | 438/3 |

OTHER PUBLICATIONS

"Spin-current interaction with a mono domain magnetic body: A model study", by J. Z. Sun, Physical Review B, vol. 62, No. 1, Jul. 1, 2004, pp. 570-578.

"Current-driven excitation of magnetic multilayers", by J.C. Slonczewski, Jrnl. of Magnetism and Magnetic Materials, vol. 159 (1996) L1-L7, 1996 Elsevier Science B.V.

"Direct-Current Induced Dynamics in $Co_{90}fe_{10}Ni_{80}Fe_{20}$ Point Contacts", vol. 92, No. 2, by W. H. Rippard et al., Week ending Jan. 16, 2004, 027201-1 to 027201-4.

* cited by examiner

*Primary Examiner*—J. H. Hur
*Assistant Examiner*—Harry W Byrne
(74) *Attorney, Agent, or Firm*—Saile Ackerman LLC; Stephen B. Ackerman

(57) ABSTRACT

A CPP MTJ MRAM element utilizes transfer of spin angular momentum as a mechanism for changing the magnetic moment direction of a free layer. The device includes a tunneling barrier layer of MgO and a non-magnetic CPP layer of Cu or Cr and utilizes a novel free layer comprising a thin layer of Ta or Hf sandwiched by layers of CoFeB. The device is characterized by values of DR/R between approximately 95% and 105%.

27 Claims, 3 Drawing Sheets

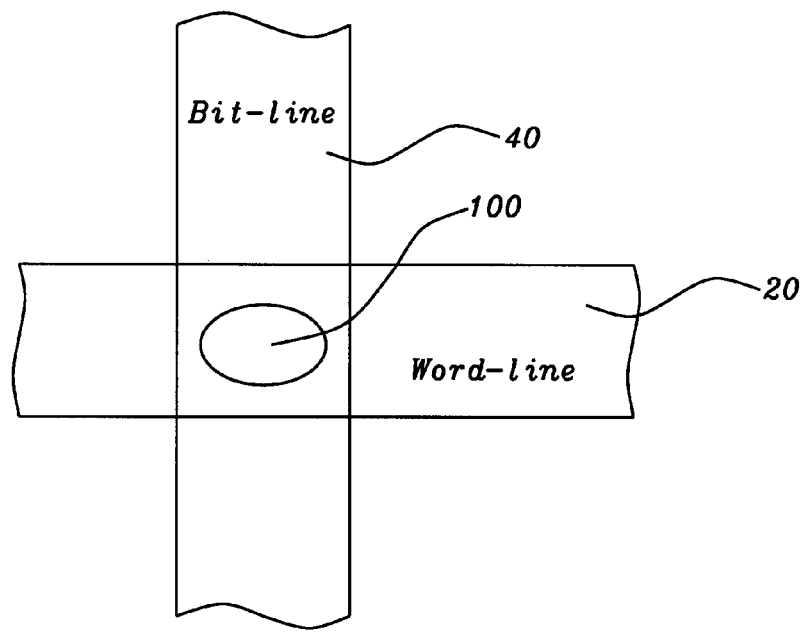
FIG. 1
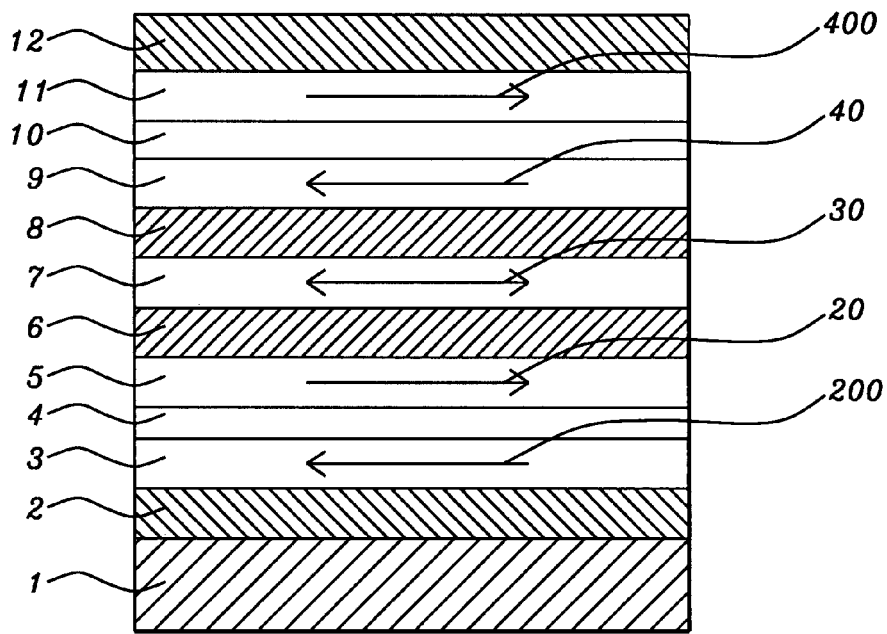
FIG. 2 - Prior Art

| Free-layer | DR/R (%) | RA (Ωμm²) | Hk (Oe) | Annealing temperature |
|---|---|---|---|---|
| CoFeB(2.5 nm) | 33.9 | 20.7 | 14.9 | 280°C |
| CoFeB(1.5 nm)/Ta(0.3 nm)/CoFeB(1 nm) | 55.2 | 19.2 | 15.1 | 280°C |
| CoFeB(1.5 nm)/Ta(0.6 nm)/CoFeB(1 nm) | 78.9 | 20.2 | 17.9 | 280°C |
| CoFeB(2 nm)/Ta(0.3 nm)/CoFeB(0.5 nm) | 67.2 | 20.2 | 21.4 | 280°C |
| CoFeB(2 nm)/Ta(0.6 nm)/CoFeB(0.5 nm) | 94.7 | 19.8 | 23.4 | 280°C |
| CoFeB(2 nm)/Ta(0.3 nm)/CoFeB(0.5 nm) | 104.8 | 21.2 | 24.6 | 280°C |

FIG. 5

SPIN TRANSFER MRAM DEVICE WITH NOVEL MAGNETIC FREE LAYER

BACKGROUND OF THE INVENTION

1. Field of the Invention

This invention relates generally to a current perpendicular to plane random access memory (CPP-MRAM) cell formed as a magnetic tunneling junction (MTJ)) and using a spin transfer effect with enhanced spin torque.

2. Description of the Related Art

The conventional magnetic tunneling junction (MTJ) device is a form of ultra-high magnetoresistive device in which the relative orientation of the magnetic moments of parallel, vertically separated, upper and lower magnetized layers controls the flow of spin-polarized electrons tunneling through a very thin dielectric layer (the tunneling barrier layer) formed between those layers. When injected electrons pass through the upper layer they are spin polarized by interaction with the magnetic moment of that layer. The majority of the electrons emerge polarized in the direction of the magnetic moment of the upper layer, the minority being polarized opposite to that direction. The probability of such a polarized electron then tunneling through the intervening tunneling barrier layer into the lower layer then depends on the availability of states within the lower layer that the tunneling electron can occupy. This number, in turn, depends on the magnetization direction of the lower electrode. The tunneling probability is thereby spin dependent and the magnitude of the current (tunneling probability times number of electrons impinging on the barrier layer) depends upon the relative orientation of the magnetizations of magnetic layers above and below the barrier layer. The MTJ device can therefore be viewed as a kind of multi-state resistor, since different relative orientations (e.g. parallel and antiparallel) of the magnetic moments will change the magnitude of a current passing through the device. In a common type of device configuration (spin filter), one of the magnetic layers has its magnetic moment fixed in direction (pinned) by exchange coupling to an antiferromagnetic layer, while the other magnetic layer has its magnetic moment free to move (the free layer). The magnetic moment of the free layer is then made to switch its direction from being parallel to that of the pinned layer, whereupon the tunneling current is large, to being antiparallel to the pinned layer, whereupon the tunneling current is small. Thus, the device is effectively a two-state resistor. The switching of the free layer moment direction (writing) is accomplished by external magnetic fields that are the result of currents passing through conducting lines adjacent to the cell.

FIG. 1 is a highly schematic drawing showing an overhead view of a conventional MRAM cell between orthogonal word (20) and bit (40) lines. The cell (100) is drawn with a slightly elliptical horizontal cross-section because such a shape produces a magnetic anisotropy within the free layer that assists its magnetic moment in retaining a thermally stable fixed position after switching fields have been turned off. The fields produced by currents in each of the two lines are between about 30 to 60 Oersteds in magnitude. According to the diagram, the word line field will be along the hard axis of the cell, the bit line field will be along the easy axis.

The use of magnetic fields externally generated by current carrying lines (as in FIG. 1) to switch the magnetic moment directions becomes problematic as the size of the MRAM cells decreases and, along with their decrease, so does the width of the current carrying lines. The smaller width lines require greater currents to produce the necessary switching fields, greatly increasing power consumption.

For this reason, a new type of magnetic device, called a spin transfer device and described by Slonczewski, (U.S. Pat. No. 5,695,164), has been developed and seems to eliminate some of the problems associated with the excessive power consumption necessitated by external switching fields. The spin transfer device shares some of the operational features of the conventional MTJ cell described above, except that the switching of the free layer magnetic moment is produced by the spin polarized current itself. In this device, unpolarized conduction electrons passing through a first magnetic layer having its magnetic moment oriented in a given direction (such as the pinned layer) are preferentially polarized by their passage through that layer by a quantum mechanical exchange interaction with the polarized bound electrons in the layer. Such a polarization can occur to conduction electrons that reflect from the surface of the magnetized layer as well as to those that pass through it. When such a stream of polarized conduction electrons subsequently pass through a second magnetic layer whose polarization direction is not fixed in space (such as the free layer), the polarized conduction electrons exert a torque on the bound electrons in the magnetic layers which, if sufficient, can reverse the polarization of the bound electrons and, thereby, reverse the magnetic moment of the magnetic layer. If the magnetic moment of the layer is directed along its easy magnetic axis, the required torque is minimized and the moment reversal occurs most easily. The use of a current internal to the cell to cause the magnetic moment reversal requires much smaller currents than those required to produce an external magnetic field from adjacent current carrying lines to produce the moment switching. Recent experimental data (W. H. Rippard et al., Phys. Rev. Lett., 92, (2004)) confirm magnetic moment transfer as a source of magnetic excitation and, subsequently, magnetic moment switching. These experiments confirm earlier theoretical predictions (J. C. Slonczewski, J. Magn. Mater. 159 (1996) L I, and J. Z. Sun, Phys. Rev. B., Vol. 62 (2000) 570). These latter papers show that the net torque, F, on the magnetization of a free magnetic layer produced by spin-transfer. from a spin-polarized DC current is proportional to:

$$\Gamma = s n_m \times (n_s \times n_m), \tag{1}$$

Where s is the spin-angular momentum deposition rate, $n_s$ is a unit vector whose direction is that of the initial spin direction of the current and $n_m$ is a unit vector whose direction is that of the free layer magnetization and x symbolizes a vector cross product. According equation (1), the torque is maximum when $n_s$ is orthogonal to $n_m$.

Huai et al. (U.S. Pat. No. 6,714,444) describes a device utilizing spin transfer which is substantially and schematically illustrated in FIG. 2. This prior art storage device consists of an underlayer (1), a first antiferromagnetic pinning layer (2), a first pinned ferromagnetic layer (3), a first non-magnetic spacer layer (4), a pinned ferromagnetic reference layer (5), a non-conducting tunneling barrier layer (6), a ferromagnetic free layer (7) (the storage layer), a non-magnetic layer (8), a pinned magnetic drive layer (9), a second non-magnetic spacing layer (10), a second pinned layer (11) and a second antiferromagnetic pinning layer (12) that pins the second pinned layer. Arrows (200), (20), (30), (40) and (400) drawn in the various layers as discussed above are exemplary magnetic moment directions. The double-headed arrow (30) in layer 7 indicates that this layer is free to have its magnetic moment directed in either of two directions.

Referring again to FIG. 2 it is noted that when the current is directed from bottom to top (layer (1) to layer (12)), conduction electrons are moving from top to bottom (layer (12) to layer (1)) and will first pass through drive layer (9) before entering free layer (7). Therefore, the free layer magnetization would be switched to the direction of the drive layer's magnetization by the spin-transfer torque when the current density is larger than some critical value.

Conversely, if the current is directed from top to bottom, the free layer magnetization would be switched to the direction of the pinned reference layer (5), since the conduction electrons have passed through that layer before entering the free layer.

In a typical prior art embodiment of the device shown in FIG. 2, the tunnel barrier layer (6) is a layer of $AlO_x$ (aluminum oxide), while non-magnetic layer (8) is a thin layer of Cu. The portion of the structure in FIG. 2 from layers (7) to (12) inclusive, is a CPP spin valve structure. The portion of the structure from (2) to (7) inclusive is a CPP magnetic tunneling (MTJ) structure in a spin filter configuration. Conduction electrons therefore, act on the free layer both by transmission (of the majority polarized electrons) and reflection (of the minority oppositely polarized electrons). Therefore, two spin torques would act on the free layer at the same time to minimize the required spin-transfer current.

The use of the spin transfer effect is also to be found in other prior art examples. Redon et al. (U.S. Pat. No. 6,532,164) discloses magnetic switching using spin transfer. Huai et al. (U.S. Pat. No. 7,126,202) discloses a spin transfer device that includes a thermal stabilization layer to maintain switched magnetic moment directions free from the thermal perturbations that can change the switched directions in a cell of small size.

The design of FIG. 2 has certain disadvantages if the tunneling barrier layer (6) is formed of MgO and the free layer (7) is CoFeB, which, together, would give very high values of DR/R (the magnetoresistance ratio, where DR is the difference between the maximum and minimum resistances of the device and R is the minimum resistance). A problem arises if the non-magnetic layer (8) is then formed of Cu, because such a layer deposited directly on top of the CoFeB free layer (7) would degrade DR/R as well as the spin momentum deposition rate s, (see equ. (1) above). The use of CoFeB in conventional MRAM devices is well known in the prior art. Deak (U.S. Pat. No. 7,083,988) disclose a free layer comprising amorphous CoFeB and also amorphous CoFeB with a thin layer of Ta formed thereon. Slaughter et al. (U.S. Pat. No. 7,067,331) discloses free layers formed as laminations of CoFeB with Ru or Rh between the layers.

The present invention will describe a spin transfer MRAM device in which a new form of free layer will address the problem cited above.

SUMMARY OF THE INVENTION

A first object of this invention is to provide a CPP-MTJ configured MRAM device of the spin transform variety in which the ratio dR/R is significantly enhanced.

A second object of the present invention is to provide such a device in which the spin angular momentum deposition rate is increased.

A third object of the present invention is to provide a CPP-MTJ configured MRAM device in which the critical spin transfer current density is reduced.

These objects will be met by a device design in which MgO serves as a tunneling barrier layer in the MTJ portion of the device, Cr (or Cu or other similar non-magnetic conductors) serves as the spacer layer in the spin-valve GMR portion of the device and the free layer is an exchange coupled lamination comprising two coupled layers of CoFeB separated by a thin layer of Ta or Hf.

BRIEF DESCRIPTION OF THE DRAWINGS

FIG. 1 is a schematic representation of a prior-art MTJ MRAM device located at the junction of word and bit lines.

FIG. 2 is a schematic cross-sectional view of a typical prior art spin-transfer device that, in the present invention, will utilize a novel free layer.

FIG. 5 is a table indicating the effects of free layers of various designs on the performance of the MRAM device of the present invention.

DESCRIPTION OF THE PREFERRED EMBODIMENTS

The preferred embodiment of the present invention is an MRAM device of the spin-transfer variety, having a CPP-MTJ configuration and including a free layer formed as an exchange coupled lamination of two CoFeB magnetic layers separated by a thin layer of Ta or Hf.

Figure 3:
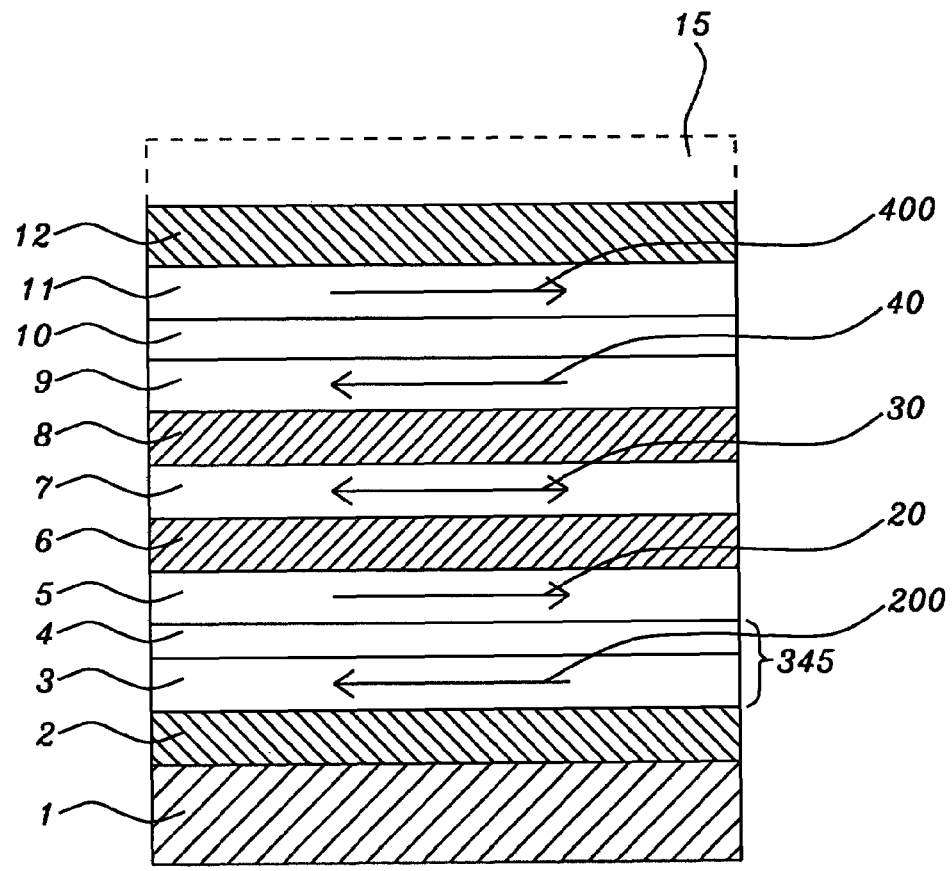
FIG. 3 is a schematic cross-sectional view of a first embodiment of the present invention.

Referring to FIG. 3, there will now be described a schematic cross-sectional view of a preferred embodiment of the present invention. Looking at the structure from the bottom upward, the embodiment comprises the following sequence of layers. Layer (1) is a substrate or underlayer. Layer (2), formed on the substrate, is a magnetic pinning layer formed of an antiferromagnetic material such as MnPt, IrMn, FeMn or NiO. Layers (3), (4) and (5) together form a exchange coupled structure, collectively denoted (345), in which layer (3) is pinned to anti-ferromagnetic layer (2) by an exchange coupling mechanism and layer (5) is pinned to layer (3) by an exchange coupling mechanism in which non-magnetic spacer layer (4), that can be a layer of Ru, Rh or Cr, serves as the coupling layer. As the oppositely directed arrows (20) and (200) depicting magnetization directions indicate, layers (3) and (5) are coupled in an anti-parallel configuration so that the (345) structure is a synthetic anti-ferromagnetic layer. Conventionally, layer (3) is denoted a pinned layer and layer (5) is denoted a reference layer. Note, however, that layer (5) is also pinned in direction, but its particular role is to provide a fixed reference direction relative to the magnetization of the free layer so as to produce a tunneling junction current varying effect. Layer (5) can be formed of layers of ferromagnetic materials such as alloys of Fe, Ni, Co and B, but it is typically formed as a layer of CoFeB. Alternatively, layer (5) can itself be a three layer synthetic anti-ferromagnetic structure comprising two ferromagnetic layers of alloys of Ni, Fe, Co and B, separated by a coupling layer of Ru, Rh or Cr. More typically, such a synthetic layer is two layers of CoFeB separated by a coupling layer of Ru, Rh or Cr.

Layer (6) is a tunneling barrier layer, formed of the dielectric material MgO. Layer (7) is a magnetically free layer, also denoted herein a storage layer, whose magnetic moment (30) direction (shown as a two-headed arrow to indicate its two possible directions), either along arrow (20) or opposite to it, determines a stored bit of magnetic information.

Figure 4:
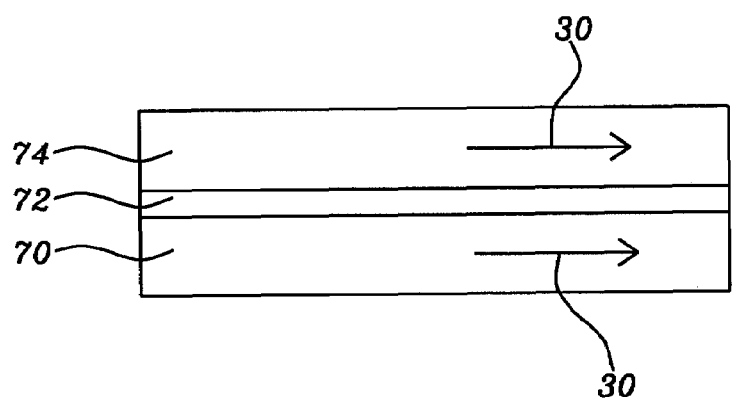
FIG. 4 is a schematic cross-sectional view of the free layer of the present invention.

FIG. 4 is a schematic illustration of the structure of the free (or "storage") layer ((7) in FIG. 3), showing it to be a lamination comprising two layers (70), (74) of CoFeB, separated by a thin layer (72) of Ta. The Ta layer is of sufficient thinness (equal to or less than approximately 0.4 nanometers) so that the two CoFeB layers (70) and (74) are strongly coupled by a parallel exchange force. Hence, the triple laminate is effectively a synthetic ferromagnetic structure. The magnetic moment arrows (30) are shown aligned in the desired parallel configuration. This new free layer structure retains a high DR/R and spin-angular momentum deposition rate when used with an MgO tunneling barrier layer (layer (6) in FIG. 3)

Returning to FIG. 3, there is next seen a thin non-magnetic layer (8), which is preferably a layer of Cr or Cu (or similar non-magnetic conductor) that serves as a spacer layer between the storage layer (7) and a pinned drive layer (9) having a magnetization depicted by arrow (40). The drive layer, which is a layer of ferromagnetic material such as CoFeB, will serve as a mechanism for polarizing conduction electrons that pass through it. When such polarized electrons traverse layer (8), retaining their polarization because of the thinness of layer (8), and strike layer (7), they transfer their individual (microscopic) spin angular momenta to the macroscopic magnetic moment of the layer (7), producing a directional change of that macroscopic quantity if the total current exceeds a critical amount.

Layer (10) is a non-magnetic coupling layer, such as a layer of Ru, Rh or Cr, serving to allow an anti-ferromagnetic coupling of the magnetizations of layer (9) and the magnetization of layer (11) (shown as arrow (400)), which is a ferromagnetic layer pinned to anti-ferromagnetic layer (12). It is noted that all magnetized layers are magnetized in the plane of their deposition. It is further noted that at least storage layer (7) is formed with a crystalline uni-axial anisotropy to produce an axis along which a magnetization direction is thermally stable. It is yet further noted that an electrically conductive bit line (15) is formed adjacent to the cell to produce a magnetic field that will bias the cell and can, thereby, pre-dispose it to change or retain the direction of its free layer magnetization.

The preferred form of the present invention, consistent with the description given above, is therefore:

AFM/CoFe(or CoFeB)/Ru/CoFeB/MgO/free layer/Cr (or Cu)/CoFe(or CoFeB)/Ru/CoFe,

Where AFM is the antiferromagnetic pinning layer, the "free layer" is the multi-layered structure: CoFeB/Ta/CoFeB, with the two CoFeB layers having parallel, exchange coupled magnetizations as shown in FIG. 4.

In the configuration shown above, from left to right, the individual layer dimensions are:

CoFe (or CoFeB), between approximately 1.5 and 5.0 nm
Ru, approximately 0.8 nm
CoFeB between approximately 1.5 and 5.0 nm
MgO between approximately 0.5 and 2.0 nm
Free layer: each CoFeB layer between approximately 1 and 2 nm, the Ta between approximately 0.3 and 0.6 nm
Cr (or Cu) between approximately 1.0 and 7.0 nm
CoFe (or CoFeB) between approximately 1.5 and 5.0 nm
Ru, approximately 0.8 nm
CoFe between approximately 1.5 and 5.0 nm.

The advantages of the present invention can be illustrated by giving some exemplary experimental results. First, a simple, non spin transferring MTJ layered structure, denoted I, and not including the free layer of the present invention, is a structure of the form:

PtMn/CoFe/Ru/CoFeB/MgO/CoFeB(2 nm)/Ta-capping.     I.

In this structure, reading from left to right, the PtMn is the anti-ferromagnetic pinning layer, the CoFe is the pinned layer, the Ru is an anti-ferromagnetic coupling layer, the CoFeB is the reference layer, the MgO is the tunneling barrier layer, the CoFeB of approximately 2.0 nm thickness is the free layer and the Ta is a capping layer on the free layer. This structure yields a MR ratio, DR/R=98.9% and a product, RA, of minimum resistance times cross-sectional area, RA=18.6 $\Omega\mu m^2$ (ohm-micron$^2$). This value will be used for comparison purposes.

Referring now to FIG. 5, there is shown a table listing the DR/R values and other physical values ($H_k$ being the free layer anisotropy) of six different free layer structures of spin transfer CPP-MTJ MRAM, for comparison with the simple structure, I, above and to indicate the advantages of the free layer of the present invention. For all six of the free layer structures whose performance is evaluated in FIG. 5, the free layer structure is formed within a simple configuration, denoted II, of the form:

PtMn/CoFe/Ru/CoFeB/MgO/free layer/Cu(2.7 nm)     II.

In CPP-MTJ spin transfer configurations such as II, the required spin transfer current must be minimized in order to make the structure maximally efficient. Therefore, the non-magnetic layer that caps the free layer should be a layer of Cu or Cr (here it is a layer of Cu of approximately 2.7 nm thickness) instead of the Ta capping layer of configuration I for a non spin transfer configuration, because the Ta capping layer destroys spin-torque transfer on the top side of the free layer, thereby destroying the required two-sided transfer of spin torque upon both transmission and reflection of the conduction electrons.

It can be seen from the first row of the table in FIG. 5, in which the free layer is a single layer of CoFeB of thickness approximately 2.5 nm, that the required layer of Cu on the free layer significantly diminishes the performance of configuration II as compared to configuration I in which the capping layer is Ta. Clearly, as the remaining rows indicate, the use of the CoFeB/Ta/CoFeB or CoFeB/Hf/CoFeB free layer significantly improves the performance of configuration II, with the greatest improvement occurring when the layers of either Ta or Hf have thicknesses of approximately 0.6 nm and the first and second CoFeB layers are approximately 2.0 nm and approximately 0.5 ml respectively. Thus, the performance of the configuration is significantly improved even though the Cu is used as the capping layer, because of the structure of the free layer.

As is finally understood by a person skilled in the art, the preferred embodiments of the present invention are illustrative of the present invention rather than limiting of the present invention. Revisions and modifications may be made to methods, materials, structures and dimensions employed in forming and providing a CPP MTJ MRAM device using transfer of spin angular momentum, while still forming and providing such a device and its method of formation in accord with the spirit and scope of the present invention as defined by the appended claims.

What is claimed is:

1. An MTJ MRAM device operating in a CPP configuration and utilizing the transfer of conduction electron spin angular momentum to change a free layer magnetization direction, comprising:

a substrate;

an MTJ element formed on said substrate, said element comprising a vertically stacked lamination of horizontal parallel layers including, therein, in the following order, an antiferromagnetic pinning layer, a pinned layer, a reference layer, a tunneling barrier layer, the free layer, a first conducting non-magnetic layer and a pinned drive layer, and wherein said free layer is a three layer laminate further comprising two layers of ferromagnetic material with a thin, second conducting non-magnetic layer formed therebetween and wherein, said ferromagnetic layers are magnetized in parallel directions within the horizontal plane of their formation, said directions being maintained by exchange coupling and wherein, said ferromagnetic layers are formed with a uni-axial magnetic anisotropy to render said magnetization directions thermally stable and wherein, a current of conduction electrons in the vertical direction can change the direction of magnetization of said free layer by both reflection and transmission, thereby minimizing the strength of the current.

2. The device of claim 1 further including an adjacent bit line, said bit line capable of producing a magnetic field to bias said device and facilitate changing the magnetization direction of said free layer.

3. The device of claim 1 wherein said free layer further comprises:
   a first layer of CoFeB
   a second layer of CoFeB, and
   a layer of Ta formed therebetween.

4. The device of claim 3 wherein said first layer of CoFeB is formed to a thickness between approximately 1 nm and 2 nm, wherein said second layer of CoFeB is formed to a thickness between approximately 1 nm and 2 nm, wherein said layer of Ta is formed to a thickness between approximately 0.3 nm and 0.6 nm.

5. The device of claim 1 wherein said free layer further comprises:
   a first layer of CoFeB
   a second layer of CoFeB, and
   a layer of Hf formed therebetween.

6. The device of claim 5 wherein said first layer of CoFeB is formed to a thickness between approximately 1 nm and 2 nm, wherein said second layer of CoFeB is formed to a thickness between approximately 1 nm and 2 nm, wherein said layer of Hf is formed to a thickness between approximately 0.3 nm and 0.6 nm.

7. The device of claim 1 wherein said reference layer is a layer of CoFeB.

8. The device of claim 1 wherein said reference layer is a synthetic antiferromagnetic layer comprising:
   a first layer of a soft magnetic alloy of Fe, Ni, Co and B;
   a second layer of a soft magnetic alloy of Fe, Ni, Co and B;
   a thin coupling layer of Ru, Rh or Cr formed therebetween; wherein
   said first and said second layers of soft magnetic alloy are magnetized in antiparallel directions by exchange coupling, forming, thereby, a synthetic anti-ferromagnetic layer.

9. The device of claim 1 wherein said drive layer is a layer of CoFeB.

10. The device of claim 1 wherein said drive layer is a synthetic antiferromagnetic layer comprising:
   a first layer of a soft magnetic alloy of Fe, Ni, Co and B;
   a second layer of a soft magnetic alloy of Fe, Ni, Co and B;
   a thin coupling layer of Ru, Rh or Cr formed therebetween; wherein
   said first and said second layers of soft magnetic alloy are magnetized in antiparallel directions by exchange coupling, forming, thereby, a synthetic anti-ferromagnetic layer.

11. The device of claim 1 wherein said drive layer is a multi-layered lamination comprising a plurality of layers of CoFe and CoFeB.

12. The device of claim 1 wherein said conducting non-magnetic layer is a layer of Cr.

13. The device of claim 1 wherein said conducting non-magnetic layer is a layer of Cu.

14. The device of claim 1 wherein said antiferromagnetic pinning laye is a layer of PtMn, IrMn, FeMn or NiO.

15. A method of forming an MTJ MRAM device operating in a CPP configuration and utilizing the transfer of conduction electron spin angular momentum to change a free layer magnetization direction, comprising:
   providing a substrate;
   forming an MTJ element on said substrate, said element comprising a vertically stacked lamination formed of horizontal parallel layers including, therein, in the following order, an antiferromagnetic pinning layer, a pinned layer, a reference layer, a tunneling barrier layer, the free layer, a first conducting non-magnetic layer and a pinned drive layer, and wherein
   said free layer is a three layer laminate further comprising two layers of ferromagnetic material and having a thin, second conducting, non-magnetic layer formed therebetween and wherein,
   said ferromagnetic layers are magnetized in parallel directions within the horizontal plane of their formation, said directions being maintained by exchange coupling and wherein,
   said ferromagnetic layers are formed with a uni-axial magnetic anisotropy to render said magnetization directions thermally stable and wherein,
   a current of conduction electrons in the vertical direction can change the direction of magnetization of said free layer by both transmission and reflection, thereby minimizing the strength of the required current.

16. The method of claim 15 further including the formation of an adjacent bit line over the top of said MTJ element, said bit line capable of producing a magnetic field to bias said device and facilitate changing the magnetization direction of said free layer.

17. The method of claim 16 wherein the formation of said free layer further comprises:
   forming a first layer of CoFeB on said tunneling barrier layer;
   forming a layer of Ta on said first layer of CoFeB.
   forming a second layer of CoFeB on said layer of Ta.

18. The method of claim 17 wherein said first layer of CoFeB is formed to a thickness between approximately 1 nm and 2 nm, wherein said second layer of CoFeB is formed to a thickness between approximately 1 nm and 2 nm and wherein said layer of Ta is formed to a thickness between approximately 0.3 nm and 0.6 nm.

19. The method of claim 16 wherein the formation of said free layer further comprises:
   forming a first layer of CoFeB on said tunneling barrier layer;
   forming a layer of Hf on said first layer of CoFeB.
   forming a second layer of CoFeB on said layer of Hf.

20. The method of claim 19 wherein said first layer of CoFeB is formed to a thickness between approximately 1 nm and 2 nm, wherein said second layer of CoFeB is formed to a thickness between approximately 1 nm and 0.5 nm, and wherein said layer of Hf is formed to a thickness between approximately 0.3 nm and 0.6 nm.

21. The method of claim 16 wherein said reference layer is a layer of CoFeB.

22. The method of claim 16 wherein said reference layer is formed as a synthetic antiferromagnetic layer, said formation comprising:
   forming a first layer of a soft magnetic alloy of Fe, Ni, Co and B on said pinned layer;
   forming a thin coupling layer of Ru, Rh or Cr on said first layer;
   forming a second layer of a soft magnetic alloy of Fe, Ni, Co and B on said thin coupling layer; wherein
   said first and said second layers of soft magnetic alloy are magnetized in antiparallel directions by exchange coupling, forming, thereby, a synthetic anti-ferromagnetic layer.

23. The method of claim 16 wherein said drive layer is a layer of CoFeB.

24. The method of claim 16 wherein said drive layer is a synthetic antiferromagnetic layer formed by a method comprising:
   forming a first layer of a soft magnetic alloy of Fe, Ni, Co and B;
   forming a thin coupling layer of Ru, Rh or Cr on said first layer;
   forming a second layer of a soft magnetic alloy of Fe, Ni, Co and B; wherein
   said first and said second layers of soft magnetic alloy are magnetized in antiparallel directions by exchange coupling, forming, thereby, a synthetic anti-ferromagnetic layer.

25. The method of claim 16 wherein said drive layer is formed as a multi-layered lamination comprising a plurality of layers of CoFe and CoFeB.

26. The method of claim 16 wherein said conducting non-magnetic layer is formed as a layer of Cr.

27. The method of claim 16 wherein said conducting non-magnetic layer is formed as a layer of Cu.

* * * * *